United States Patent
Song et al.

(10) Patent No.: US 8,106,675 B2
(45) Date of Patent: Jan. 31, 2012

(54) TEST SYSTEM

(75) Inventors: Ki-Jae Song, Paju-si (KR); Hun-Kyo Seo, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 325 days.

(21) Appl. No.: 12/458,008

(22) Filed: Jun. 29, 2009

(65) Prior Publication Data

US 2009/0322369 A1    Dec. 31, 2009

(30) Foreign Application Priority Data

Jun. 30, 2008 (KR) ........................ 10-2008-0062440

(51) Int. Cl.
*G01R 31/02* (2006.01)
(52) U.S. Cl. .............................. 324/762.01; 324/762.05
(58) Field of Classification Search . 324/762.01–762.09
See application file for complete search history.

(56) References Cited

U.S. PATENT DOCUMENTS

| | | | |
|---|---|---|---|
| 6,192,496 B1* | 2/2001 | Lawrence et al. | 714/724 |
| 6,275,023 B1* | 8/2001 | Oosaki et al. | 324/756.06 |
| 6,812,691 B2* | 11/2004 | Miller | 324/762.03 |
| 6,940,271 B2* | 9/2005 | West | 324/750.01 |
| 7,019,547 B2* | 3/2006 | Aghaeepour | 324/762.01 |
| 7,102,375 B2* | 9/2006 | Walker et al. | 324/750.01 |
| 2006/0202707 A1* | 9/2006 | Harjung | 324/754 |
| 2007/0069755 A1* | 3/2007 | Sartschev | 324/765 |

FOREIGN PATENT DOCUMENTS

| | | |
|---|---|---|
| JP | 09-311161 | 12/1997 |
| JP | 2003-086684 | 3/2003 |
| KR | 10-0750397 | 8/2007 |

* cited by examiner

*Primary Examiner* — Huy Q Phan
*Assistant Examiner* — Joshua Benitez
(74) *Attorney, Agent, or Firm* — Harness, Dickey & Pierce, P.L.C.

(57) ABSTRACT

A test system may include a test device, a switching unit and/or a test board. The test device may be configured to generate a first test signal swinging between a first voltage level and a second voltage level, and the first voltage level may be lower than the second voltage level. The switching unit may be coupled to the test device, and configured to switch the first test signal to provide a second test signal swinging between a third voltage level and a fourth voltage level. The third voltage level may be lower than the fourth voltage level. A plurality of devices under test (DUTs) may be mounted on the test board. Each of the plurality of DUTs may be connected in parallel with respect to one another to the switching unit through a transmission line.

17 Claims, 8 Drawing Sheets

TEST SYSTEM

PRIORITY STATEMENT

This application claims priority under 35 USC §119 to Korean Patent Application No. 2008-0062440, filed on Jun. 30, 2008, in the Korean Intellectual Property Office (KIPO), the entire contents of which are herein incorporated by reference.

BACKGROUND

1. Technical Field

Example embodiments relate to a test system, and more particularly, to a test system that performs a package test.

2. Description of the Related Art

Increasing the operating speed of memories in many applications and manufacturing memory devices that operate faster is widely required. A package test is necessarily performed to evaluate the memory devices that operate faster. The manufacturers test simultaneously many memory devices in order to reduce the cost of the backend process. A test system transfers simultaneously a test pattern to many memory devices on a test board through a branch configuration.

When data is transferred to memory devices that operate slowly through the branch configuration, there are few problems. However, when data is transferred to memory devices that operate faster through the Brach configuration, capacitive values existing in the memory devices becomes larger to increase a time constant. In addition, waves are reflected in the branch due to impedance mismatching. Therefore, input signals, e.g., test patterns, are not properly transferred to the memory devices that operate faster and signal integrity is degraded. In addition, when a number of layers that are packaged increases causing a gap between the layers, matching impedance is more difficult.

SUMMARY

Example embodiments provide a test system capable of preventing or reducing signal integrity from being degraded, and capable of providing impedance matching.

According to example embodiments, a test system may include a test device, a switching unit and/or a test board. The test device is configured to generate a first test signal swinging between a first voltage level and a second voltage level, and the first voltage level may be lower than the second voltage level. The switching unit may be coupled to the test device, and may switch the first test signal to provide a second test signal swinging between a third voltage level and a fourth voltage level. The third voltage level may be lower than the fourth voltage level. A plurality of devices under test (DUTs) may be mounted on the test board. Each of the plurality of DUTs may be connected in parallel with respect to one another to the switching unit through a transmission line.

In example embodiments, the first and second test signals may have substantially the same voltage level. In example embodiments, the switching unit may correspond to a transistor including a control electrode configured to receive the first test signal, a first terminal coupled to a first power supply voltage and a second terminal coupled to a second power supply voltage, and the second test signal may be provided at the first terminal.

In example embodiments, the transmission line may correspond to a micro-stripe line. The second test signal may be simultaneously applied to the plurality of DUTs through the transmission line. In example embodiments, a first equivalent impedance from the test device to the switching unit may be substantially the same as a second equivalent impedance from the switching unit to the plurality of DUTs.

In example embodiments, the switching unit may be included in the test device. In example embodiments, the switching unit may be included in the test board. In example embodiments, the switching unit may be included in one of the plurality of DUTs. In example embodiments, an eye-open window measured in the DUTs may be maximized or increased at an operating frequency of the plurality of DUTs. In example embodiments, the plurality of DUTs may be memory devices.

According to example embodiments, a test system may include a test device, an interface device and/or a test board. The test device is configured to generate a first test signal swinging between a first voltage level and a second voltage level, and the first voltage level may be lower than the second voltage level. The interface device may be coupled to the test device through a driving port, the interface device may include a plurality of switching units coupled in parallel with respect to one another to the driving port through a first transmission line, and each of the plurality of switching units switches the first test signal to provide a second test signal. The test board may include a plurality of DUTs mounted thereon, each of the plurality of DUTs being connected in parallel with respect to one another to each of the plurality of switching units through a plurality of second transmission lines In example embodiments, each of the plurality of switching units may correspond to a transistor including a control electrode configured to receive the first test signal, a first terminal coupled to a first power supply voltage and a second terminal coupled to a second power supply voltage, and the second test signal may be provided at the first terminal.

In example embodiments, each of the plurality of second transmission lines may correspond to a micro-stripe line. In example embodiments, levels of voltage signals measured at the plurality of DUTs may be adjusted by adjusting voltage levels of the first and second power supply voltages. In example embodiments, each of the plurality of switching units may be connected to a same number of the plurality of DUTs.

According to example embodiments, a test system may include a test device and/or a test board. The test device is configured to generate a first test signal swinging between a first voltage level and a second voltage level, and the first voltage level may be lower than the second voltage level. The test board may be coupled to the test device. A plurality of DUTs may be mounted on the test board. The plurality of DUTs are grouped into a plurality of groups, and each group may include the same number of the plurality of DUTs coupled in parallel with respect to one another to the test device through each of a plurality of transmission lines. One DUT of each group of the plurality of DUTs includes a switching unit, the switching unit switching the first test signal from the test device to provide a second test signal to the other plurality of DUTs in the group. In example embodiments, the switching unit may correspond to a transistor including a control electrode receiving the first test signal, a first terminal coupled to a first power supply voltage and a second terminal coupled to a second power supply voltage, and the second test signal may be provided at the first terminal.

In example embodiments, each of the plurality of transmission lines may correspond to a micro-stripe line. Accordingly, reducing current consumption by preventing or reducing leakage according to example embodiments is possible.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF EXAMPLE EMBODIMENTS

Figure 1:
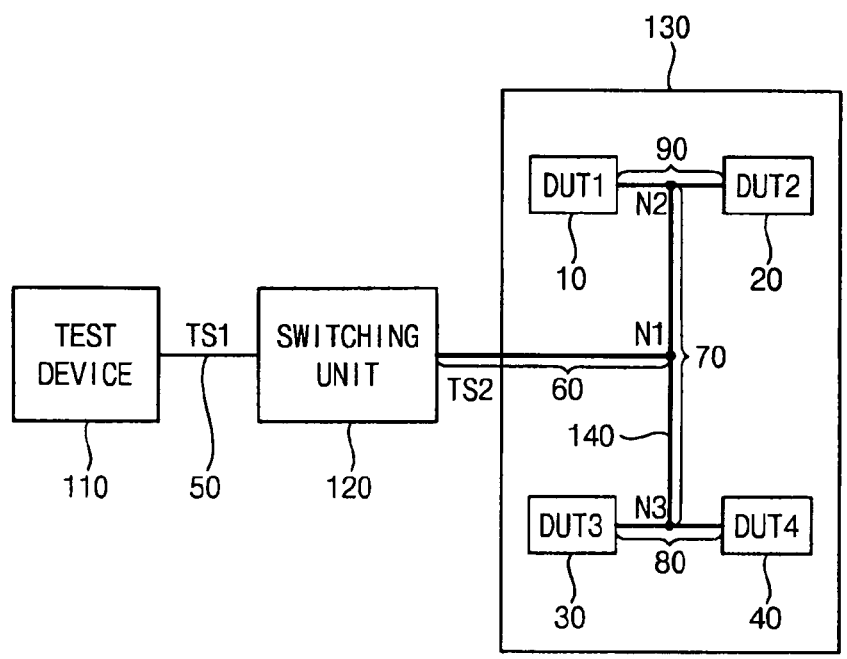
FIG. 1 is a circuit diagram illustrating a level shifting circuit according to example embodiments.

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a test system according to example embodiments. Referring to FIG. 1, a test system 100 may include a test device 110, a switching unit 120, and/or a test board 130. The test device 110 may be coupled to the switching unit 120 through a first transmission line 50, generates a first test signal TS1, and applies the first test signal TS1 to the switching unit 120. The first test signal ST1 swings between a first voltage level and a second voltage level, and the first voltage level may be lower than the second voltage level. The switching unit 120 may be coupled to the test board 130 through a second transmission line 140, switches the first test signal TS1, and provides a second test signal TS2 to the test board 130. The second test signal TS2 swings between a third voltage level and a fourth voltage level. The third voltage level may be lower than the fourth voltage level. The first and second test signals TS1 and TS2 may have same voltage levels with respect to each other.

A plurality of devices under test (DUTs) 10, 20, 30, and 40 may be connected to one another through the second transmission line 140. The plurality of DUTs 10, 20, 30, and 40 are memory devices. The second transmission line 140 branches at first, second, third nodes N1, N2, and N3, and connected to the DUTs 10, 20, 30, and 40. The second test signal TS2 from the switching unit 120 may be simultaneously applied to the DUTs 10, 20, 30, and 40. The second transmission line 140 may be implemented with a strip line between layers of a multi-layered printed circuit board (PCB). The second transmission line 140 may include a first portion 60, a second portion 70, a third portion 80, and a fourth portion 90.

When the second transmission line 140 is implemented with a strip line, impedances of the first through fourth portions 60, 70, 80 and 90 may be adjusted by adjusting line width of the first through fourth portions 60, 70, 80 and 90. When an impedance of the first portion 60 is about 50Ω, an impedance of the second portion may be adjusted to about 100Ω by adjusting the line width of the second portion 70, each impedance of the third and fourth portions 80 and 90 may be adjusted to about 2000Ω by adjusting each line width of the third and fourth portions 80 and 90. Therefore, impedance matching may be accomplished at branches, for example, the nodes N1, N2 and N3, and thus, influence of reflected waves at the nodes N1, N2 and N3 may be minimized or reduced. That is, a first equivalent impedance from the test device 110 to the switching unit 120 may be adjusted substantially the same as a second equivalent impedance from the switching unit 120 to the DUTs 10, 20, 30, and 40.

Figure 2:
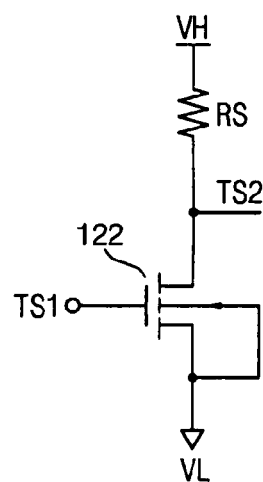
FIG. 2 is a circuit diagram illustrating the switching unit of FIG. 1.

FIG. 2 is a circuit diagram illustrating the switching unit of FIG. 1. Referring to FIG. 2, the switching unit 120 may include a transistor 122. The first test signal TS1 may be applied to a control electrode, e.g., a gate of the transistor 122. A first terminal of the transistor 122 may be connected to a first power supply voltage VH through a resistor RS. The second test signal TS2 may be provided at the first terminal of the transistor 122. A second terminal of the transistor 122 may be connected to a second power supply voltage VL. In addition, a body of the transistor 122 may be connected to the second power supply voltage VL. The transistor 122 may be coupled between the first power supply voltage VH and the second power supply voltage VL, and may switch the first test signal TS1 to provide the second test signal TS2. A voltage level of the second test signal TS2 may be adjusted by adjusting voltage levels of the first power supply voltage VH and the second power supply voltage VL. For example, when the first test signal TS1 swings between 0V (first voltage level) and 3V (second voltage level), the second test signal swings between 0V (third voltage level) and 3V (fourth voltage level) by setting the first power supply voltage VH to 3V and the second power supply voltage VL to 0V. That is, the switching unit 120 may regenerate the second test signal TS2 having a same voltage level as the first test signal TS1 from the test device 110.

Figure 3A:
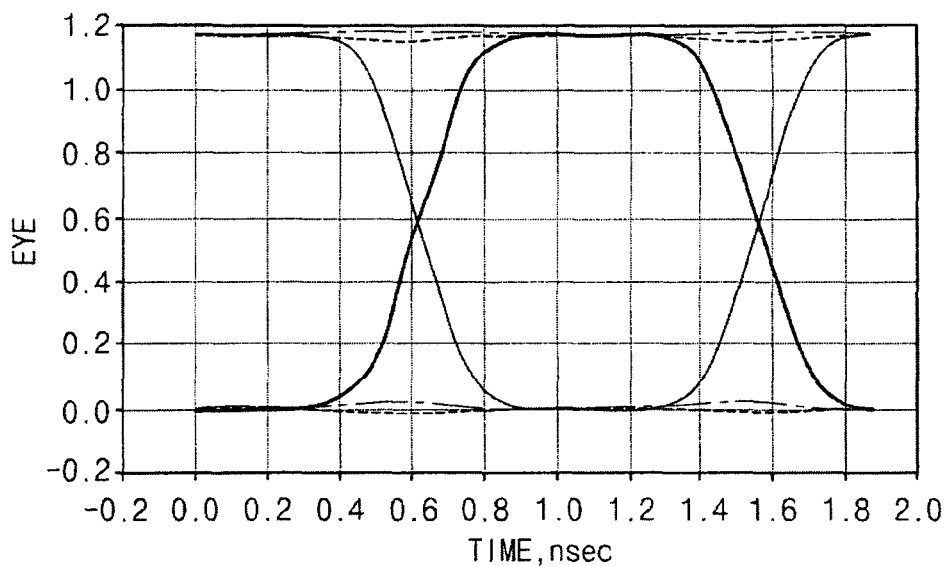
FIGS. 3A and 3B illustrate eye diagrams measured at the DUTs of FIG. 1.
Figure 3B:
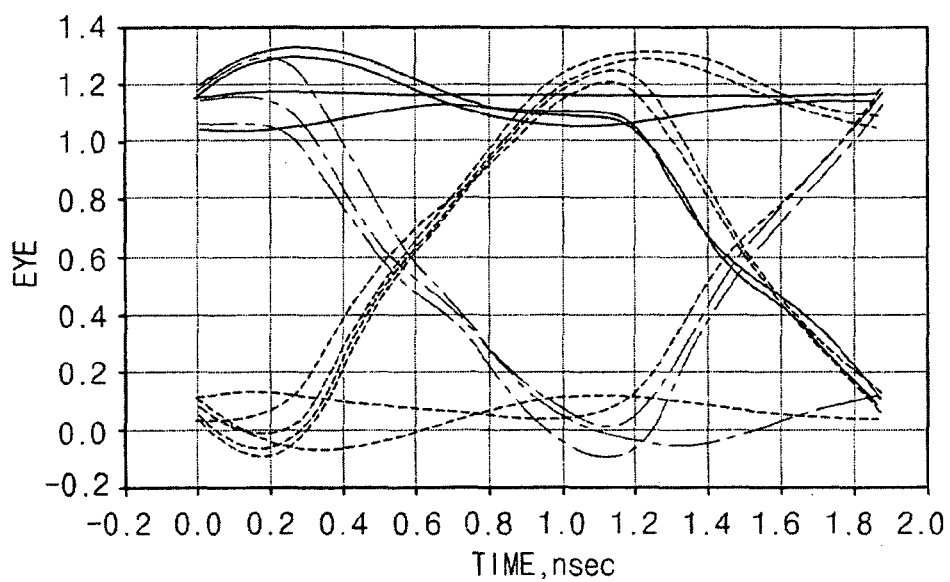

FIGS. 3A and 3B illustrate eye diagrams measured at the DUTs of FIG. 1. Eye diagram shows eye-shaped waveforms appearing when binary bits '001', '010', '011', '100', '101', and '110' are applied to and input signal transferred through the transmission line. In the eye diagram, as an eye-open window becomes larger, the test system is more improved in signal integrity.

FIG. 3A is an eye diagram measured in one of the DUTs 10, 20, 30, and 40 of the test system of FIG. 1 according to example embodiments. FIG. 3A is an eye diagram measured at operating frequency of the DUTs 10, 20, 30, and 40. FIG. 3B is an eye diagram measured in one of the DUTs 10, 20, 30, and 40 of the test system of FIG. 1 when the switching unit 120 is not included in the test system.

Referring to FIGS. 3A and 3B, an eye-open window of FIG. 3A may be larger than an eye-open window of FIG. 3B. That is, the eye-open window of the DUTs 10, 20, 30, and 40 in the test system 100 may be the maximum. The switching unit 120 of FIG. 1 may be included in the test device 110, the test board 130, or one of the DUTs 10, 20, 30, and 40 according to example embodiments.

Figure 4:
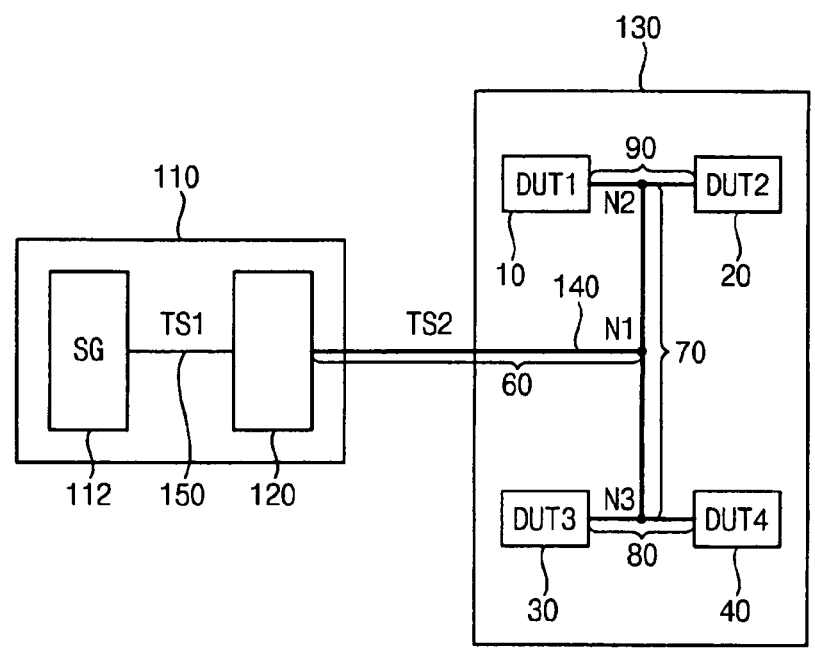
FIG. 4 is a block diagram illustrating a test system according to example embodiments.

FIG. 4 is a block diagram illustrating a test system according to example embodiments. Referring to FIG. 4, a test system 200 may include a test device 110 and/or a test board 130. The test device 110 may include a signal generator 112 and a switching unit 120. The signal generator 112 generates a first test signal TS1. The switching unit 120 may be implemented with the transistor 112 of FIG. 2. The signal generator 112 may be connected to the switching unit 120 through a first transmission line 150. The first transmission line 150 may be implemented with another connection device that connects the signal generator 112 and the switching unit 120. A plurality of DUTs 10, 20, 30 and 40 may be connected in parallel with one another through a second transmission line 140. The DUTs 10, 20, 30 and 40 may be memory devices.

The second transmission line 140 may be branched at first, second, third nodes N1, N2, and N3, and connected to the DUTs 10, 20, 30, and 40. The second test signal TS2 from the switching unit 120 may be simultaneously applied to the DUTs 10, 20, 30, and 40. The second transmission line 140 may be implemented with a strip line between layers of a multi-layered printed circuit board (PCB). When the second transmission line 140 is implemented with a strip line, impedances of the first through fourth portions 60, 70, 80 and 90 may be adjusted by adjusting line width of the first through fourth portions 60, 70, 80 and 90. The test system 200 of FIG. 4 may be different from the test system 100 of FIG. 1 in that the switching unit 120 is included in the test device 110, and thus, repeated description will be omitted.

Figure 5:
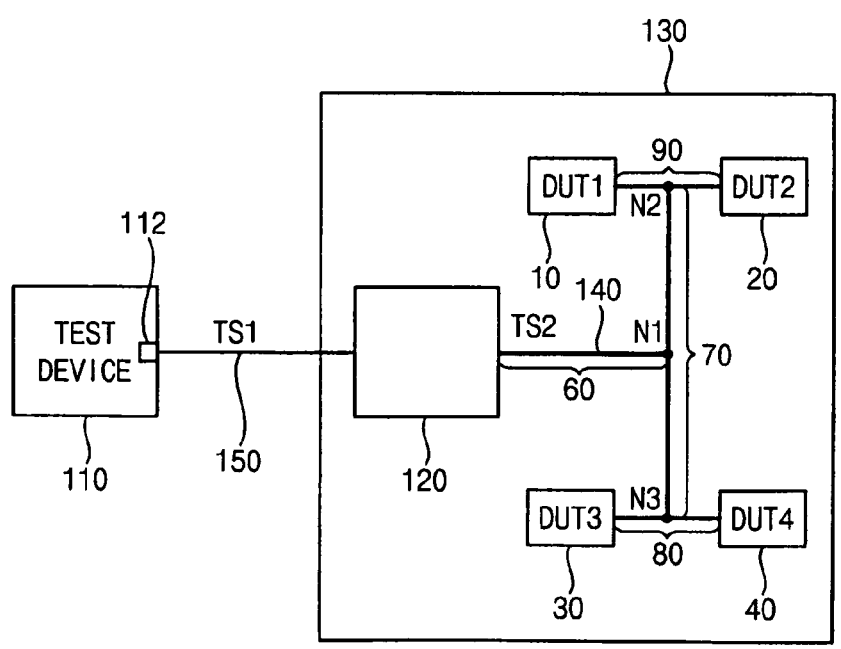
FIG. 5 is a block diagram illustrating a test system according to example embodiments.

FIG. 5 is a block diagram illustrating a test system according to example embodiments. Referring to FIG. 5, a test system 300 may include a test device 110 and/or a test board 130. The test board 140 may include a switching unit 120 and a plurality of DUTs 10, 20, 30 and 40. The test device 110 generates a first test signal TS1. The test device 110 may be connected to the test board 130 with a first transmission line 150. The first transmission line 150 may be implemented with another connection device that connects the signal generator 112 and the switching unit 120. The plurality of DUTs 10, 20, 30 and 40 are connected in parallel with one another through a second transmission line 140. The DUTs 10, 20, 30 and 40 may be memory devices.

The second transmission line 140 may be branched at first, second, third nodes N1, N2, and N3, and connected to the DUTs 10, 20, 30, and 40. The second test signal TS2 from the switching unit 120 may be simultaneously applied to the DUTs 10, 20, 30, and 40. The second transmission line 140 may be implemented with a strip line between layers of a multi-layered printed circuit board (PCB). When the second transmission line 140 is implemented with a strip line, impedances of the first through fourth portions 60, 70, 80 and 90 may be adjusted by adjusting line width of the first through fourth portions 60, 70, 80 and 90. The test system 300 of FIG. 5 may be different from the test system 100 of FIG. 1 in that the switching unit 120 is included in the test board 130, and thus repeated description will be omitted.

Figure 6:
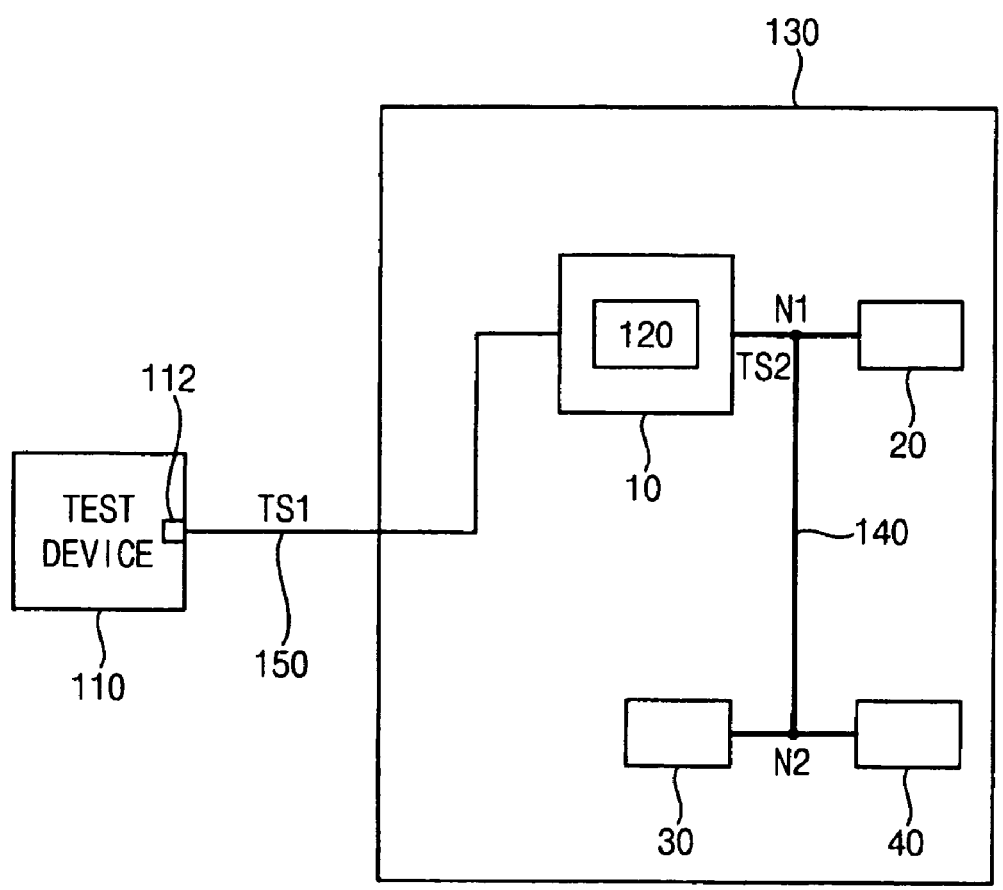
FIG. 6 is a block diagram illustrating a test system according to example embodiments.

FIG. 6 is a block diagram illustrating a test system according to example embodiments. Referring to FIG. 6, a test system 400 may include a test device 110 and/or a test board 130. The test board 140 may include a plurality of DUTs 10, 20, 30 and 40. One of the DUTs 10, 20, 30 and 40, for example, the DUT 10, may include a switching unit 120. The test device 110 generates a first test signal TS1. The test device 110 may be connected to the test board 130 with a first transmission line 150.

The second transmission line 140 may be branched at first and second nodes N1 and N2, and connected to the DUTs 20, 30, and 40. The first transmission line 150 may be implemented with another connection device that connects the signal generator 112 and the switching unit 120. The DUT 10 may be connected in parallel to other DUTs 20, 30 and 40 through a second transmission line 140. The second test signal TS2 from the switching unit 120 included in the DUT 10 may be simultaneously applied to the DUTs 20, 30, and 40. The second transmission line 140 may be implemented with a strip line between layers of a multi-layered PCB. The test system 400 of FIG. 6 may be different from the test system 100 of FIG. 1 in that the switching unit 120 is included in the DUT 10, and thus repeated description will be omitted.

In the test systems 200, 300, and 400 of FIGS. 4, 5, and 6, the switching unit 120 is in different locations than in the test system 100 of FIG. 1, but substantially the same signal integrity may be obtained in the DUTs 10, 20, 30 and 40. That is, the eye diagram of FIG. 3 may be measured in the DUTs 10, 20, 30 and 40 of the test systems 200, 300, and 400 of FIGS. 4, 5, and 6.

Figure 7:
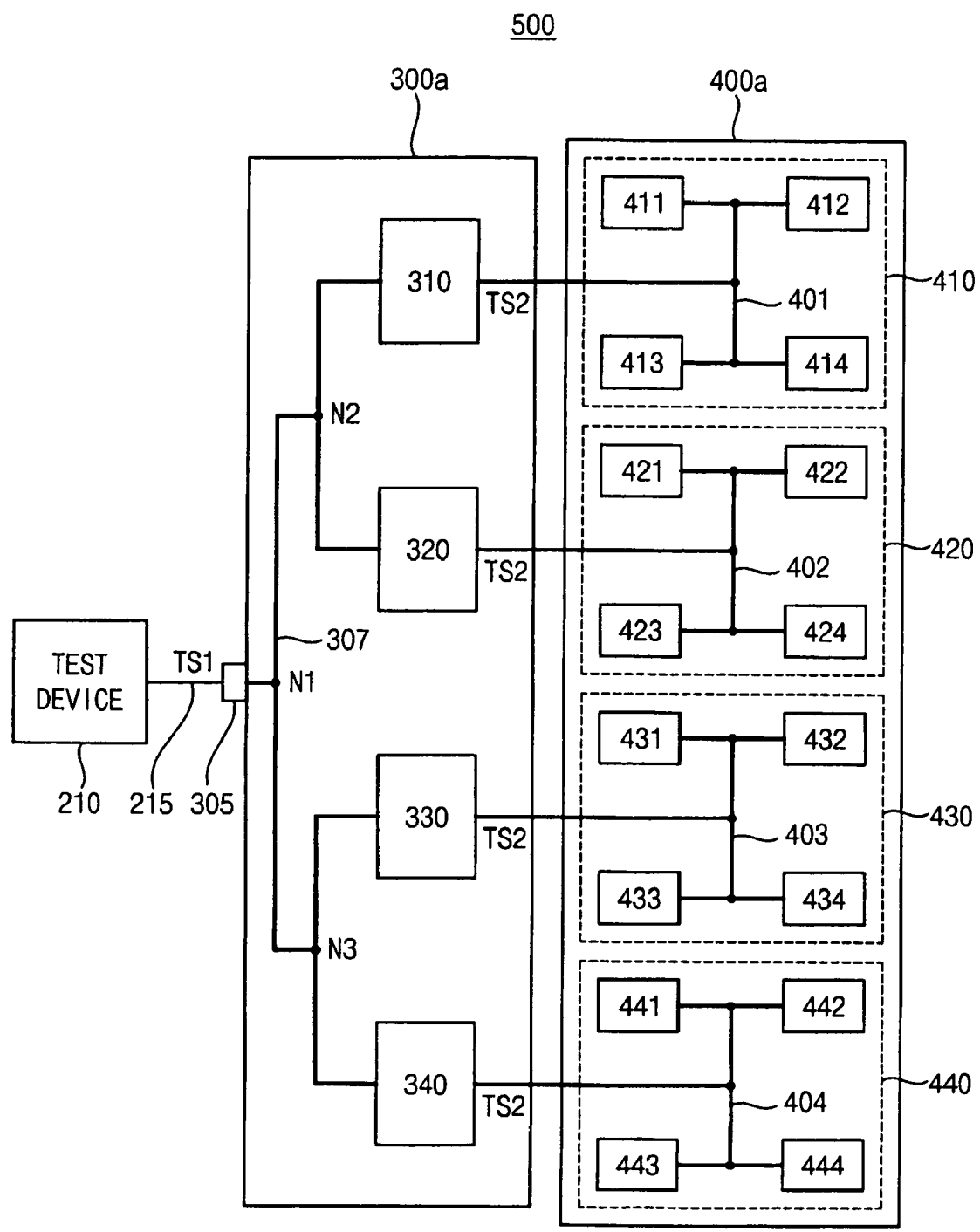
FIG. 7 is a block diagram illustrating a test system according to example embodiments.

FIG. 7 is a block diagram illustrating a test system according to example embodiments. Referring to FIG. 7, a test system 500 may include a test device 210, an interface device 300a and/or a test board 400a.

The test device 210 generates a first test signal TS1 swinging between a first voltage level and a second voltage level, and the first voltage level may be lower than the second voltage level. The test device 210 may be connected to the interface device 300a through a line 215. The interface device 300a may be connected to the test device 210 through a driving port 305.

The interface device 300a may include a plurality of switching units 310, 320, 330, and 340. Each of the switching units 310, 320, 330, and 340 may be connected to the driving port 305, and switches the first test signal TS1 through the driving port 305 from the test device 210 to provide a second test signal TS2 swinging between a third voltage level and a fourth voltage level. The third voltage level may be lower than the fourth voltage level. The driving port 305 may be connected to each of the switching units 310, 320, 330, and 340 through a first transmission line 307. The first transmission line 307 may be implemented with a strip line. The first transmission line 307 branches at nodes N1, N2, and N3. When the first transmission line 307 is implemented with a strip line, a line width of branching portion of the strip line may be adjusted for minimizing or reducing reflected waves at the branched nodes N1, N2, and N3 thereby providing impedance matching.

The test board 400a may include a plurality of DUTs 411, 412, 413, 414, 421, 422, 423, 424, 431, 432, 433, 434, 441, 442, 443, and 444. The plurality of DUTs 411, 412, 413, 414, 421, 422, 423, 424, 431, 432, 433, 434, 441, 442, 443, and 444 are grouped by a same number of DUTs. A first group 410 may include the DUTs 411, 412, 413, and 414, a second group 420 may include the DUTs 421, 422, 423 and 424, a third group 430 may include the DUTs 431, 432, 433 and 434, and a fourth group 440 may include the DUTs 441, 442, 443, and 444.

The DUTs 411, 412, 413, and 414 of the first group 410 are connected in parallel with respect to one another to the switching unit 310 through a second transmission line 401. The second test signal TS2 from the test device 310 may be simultaneously applied to the DUTs 411, 412, 413, and 414 of the first group 410. The DUTs 421, 422, 423 and 424 of the second group 420 are connected in parallel with respect to one another to the switching unit 320 through a second transmission line 402. The second test signal TS2 from the test device 320 may be simultaneously applied to the DUTs 421, 422, 423, and 424 of the second group 420. The DUTs 431, 432, 433 and 434 of the third group 430 are connected in parallel with respect to one another to the switching unit 330 through a second transmission line 403. The second test signal TS2 from the test device 330 may be simultaneously applied to the DUTs 431, 432, 433, and 434 of the third group 430. The DUTs 441, 442, 443 and 444 of the fourth group 440 are connected in parallel with respect to one another to the switching unit 340 through a second transmission line 404. The second test signal TS2 from the test device 340 may be simultaneously applied to the DUTs 441, 442, 443, and 444 of the fourth group 440.

Each of the switching units 310, 320, 330, and 340 may be implemented with the transistor 122 of FIG. 2. Therefore, the first test signal TS1 may be applied to a control electrode, e.g., a gate of the transistor 122. A first terminal of the transistor 122 may be connected to a first power supply voltage VH through a resistor RS. The second test signal TS2 may be provided at the first terminal of the transistor 122. A second terminal of the transistor 122 may be connected to a second power supply voltage VL. In addition, a body of the transistor 122 may be connected to the second power supply voltage VL. The transistor 122 may be coupled between the first power supply voltage VH and the second power supply voltage VL, switches the first test signal TS1 to provide the second test signal TS2. A voltage level of the second test signal TS2 may be adjusted by adjusting voltage levels of the first power supply voltage VH and the second power supply voltage VL. For example, when the first test signal TS1 swings between 0V (first voltage level) and 3V (second voltage level), the second test signal swings between 0V (third voltage level) and 3V (fourth voltage level) by setting the first power supply voltage VH to 3V and the second power supply voltage VL to 0V. That is, each of the switching units 310, 320, 330, and 340 may regenerate the second test signal TS2 having a same voltage level as the first test signal TS1 from the test device 210.

Each of the second transmission lines 401, 402, 403, and 404 may employ a same branch configuration as the branch configuration of the second transmission line 140 in the test system 100 of FIG. 1. In addition, each of the second transmission lines 401, 402, 403, and 404 may be implemented with a strip line, and thus, the line width of the branching portion of the strip line may be adjusted for minimizing or reducing reflected waves thereby providing impedance matching as the line width of the portions 60, 70, 80, and 90 of the second transmission line 140 is adjusted in FIG. 1.

Figure 8A:
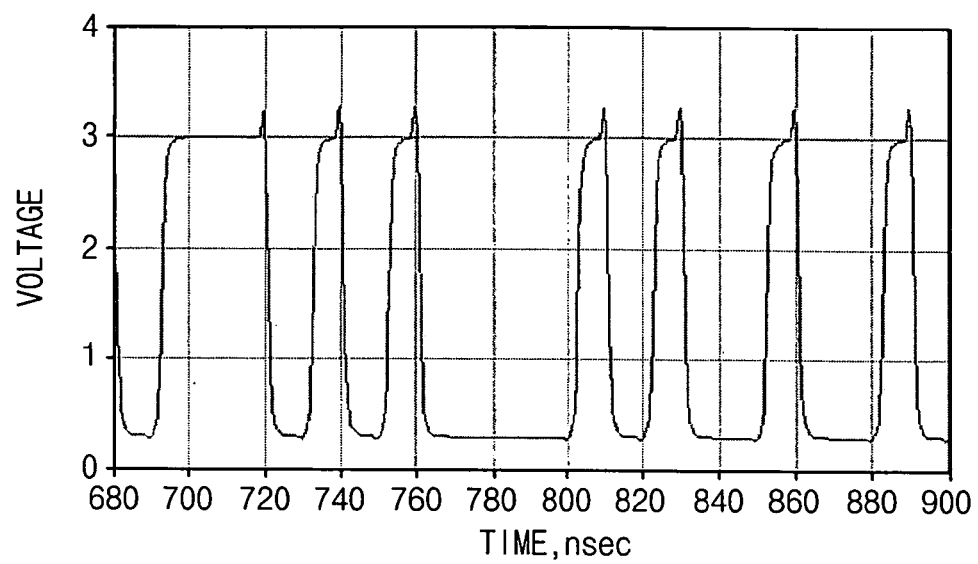
FIGS. 8A through 8D illustrate waveforms of voltage signal measured in the test system of FIG. 7.
Figure 8B:
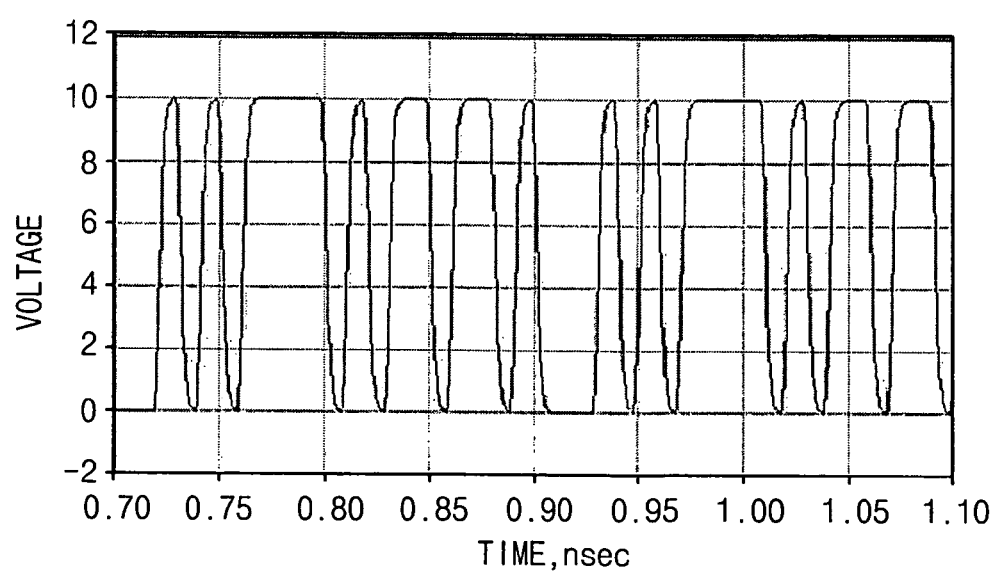
Figure 8C:
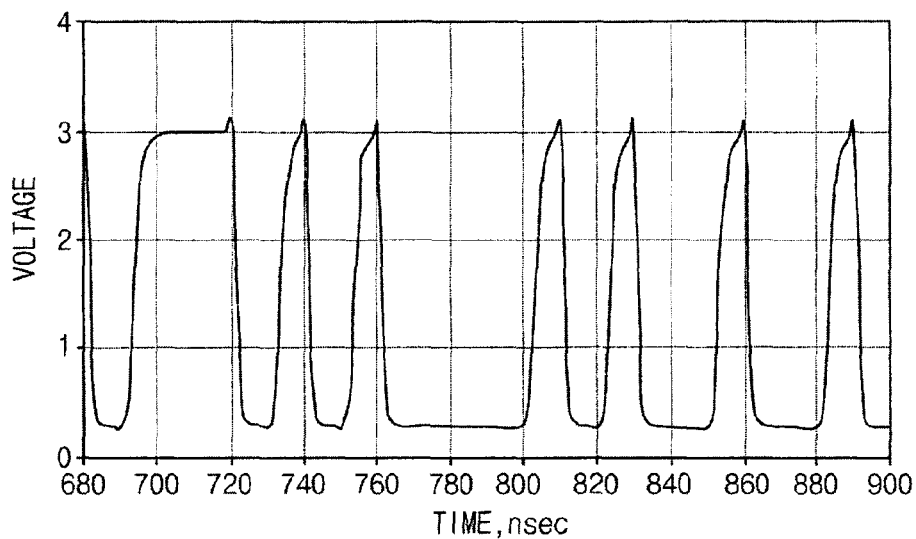
Figure 8D:
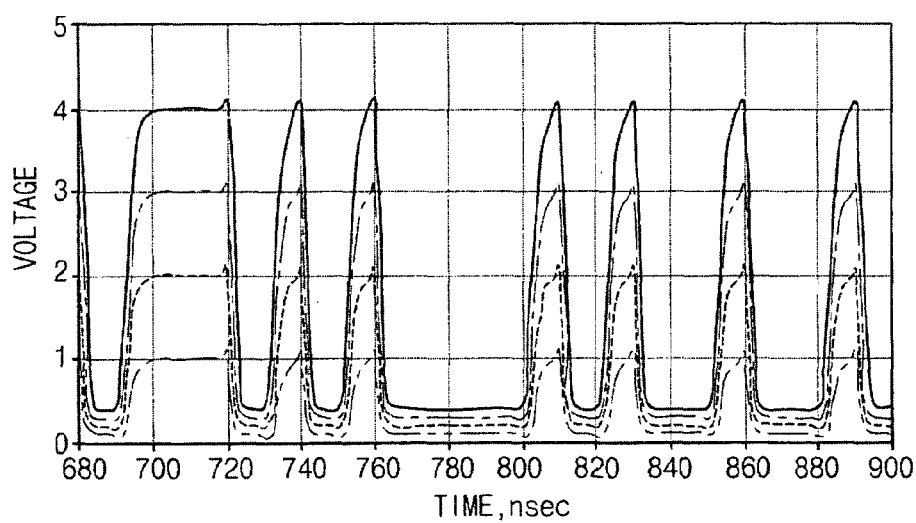

FIGS. 8A through 8D illustrate waveforms of voltage signal measured in the test system of FIG. 7. In FIGS. 8A through 8D, a frequency of the first test signal TS1 is about 100 MHz. FIG. 8A illustrates the first test signal TS1 from the test device 210 and the second test signal TS2 from each of the switching units 310, 320, 330, and 340. That is, the second test signal TS 2 is regenerated to have substantially the same voltage level as the first test signal TS1. FIG. 8B illustrates a signal measured in the first transmission line 307. FIG. 8C illustrates a signal measured in each of the DUTs 414, 424, 434, and 444.

Referring to FIGS. 8A through 8C, when the first test signal TS1 is altered due to passing through the first transmission line 307, each of the switching units 310, 320, 330, and 340 may recover the second test signal TS to have substantially the same voltage level as the first test signal TS1. Therefore, each of the DUTs 414, 424, 434, and 444 may receive a test signal that has substantially same voltage level as the first test signal TS1.

FIG. 8C illustrate a signal measured in the DUTs when voltage levels of the first power supply voltage VH and the second power supply voltage VL are adjusted in each of the switching units 310, 320, 330, and 340. When the voltage levels of the first power supply voltage VH and the second power supply voltage VL are adjusted differently in each of the switching units 310, 320, 330, and 340, a test signal having desired voltage levels may be obtained.

The interface device 300a may be included in the test device 210 in example embodiments. The interface device 300a may be directly connected to the test board 400a in example embodiments. When the interface device 300a is directly connected to the test board 400a, the driving port may be one channel.

Figure 9:
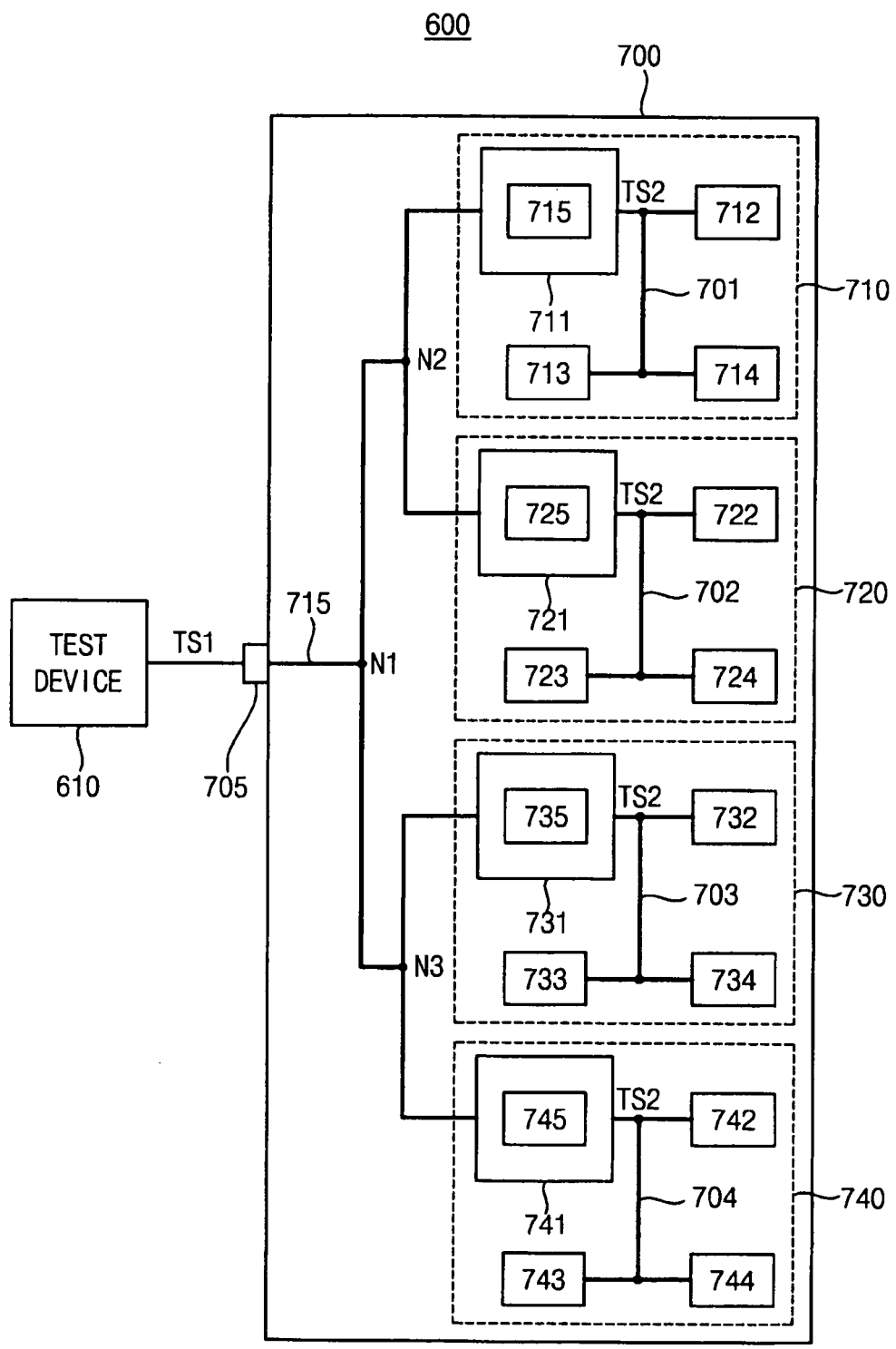
FIG. 9 is a block diagram illustrating a test system according to example embodiments.

FIG. 9 is a block diagram illustrating a test system according to example embodiments. Referring to FIG. 9, a test system 600 may include a test device 610 and/or a test board 700. The test device 610 generates a first test signal TS1 swinging between a first voltage level and a second voltage level, and the first voltage level may be lower than the second voltage level. The test device 610 may be connected to the test board 700 through a driving port 705.

The test board 700 may include a plurality of DUTs 711, 712, 713, 714, 721, 722, 723, 724, 731, 732, 733, 734, 741, 742, 743, and 744. The plurality of DUTs 711, 712, 713, 714, 721, 722, 723, 724, 731, 732, 733, 734, 741, 742, 743, and 744 are grouped by a same number of DUTs. A first group 710 may include the DUTs 711, 712, 713, and 714, a second group 720 may include the DUTs 721, 722, 723 and 724, a third group 730 may include the DUTs 731, 732, 733 and 734, and a fourth group 740 may include the DUTs 741, 742, 7443, and 744.

The DUTs 711, 712, 713, and 714 of the first group 710 are connected in parallel with respect to one another through a second transmission line 701. Each of the DUT 711 of the first group 710, the DUT 721 of the second group 720, the DUT 731 of the third group 730, and the DUT 741 of the fourth group 740 may be connected to the test device 610 through the driving port 705 and the first transmission line 715, and receives the first test signal TS1. Each of the DUT 711 of the first group 710, the DUT 721 of the second group 720, the DUT 731 of the third group 730, and the DUT 741 of the fourth group 740 may include each of switching units 715, 725, 735, and 745. The switching unit 715 switches the first test signal TS1 to provide a second test signal TS2 to the DUTs 712, 713, and 714 of the first group 710. The switching unit 725 switches the first test signal TS1 to provide the second test signal TS2 to the DUTs 722, 723, and 724 of the second group 720. The switching unit 735 switches the first test signal TS1 to provide the second test signal TS2 to the DUTs 732, 733, and 734 of the third group 730. The switching unit 745 switches the first test signal TS1 to provide the second test signal TS2 to the DUTs 742, 743, and 744 of the fourth group 740.

Each of the switching units 715, 725, 735, and 745 may be implemented with the transistor 122 of FIG. 2. Therefore, the first test signal TS1 may be applied to a control electrode, e.g., a gate of the transistor 122. A first terminal of the transistor 122 may be connected to a first power supply voltage VH through a resistor RS. The second test signal TS2 may be provided at the first terminal of the transistor 122. A second terminal of the transistor 122 may be connected to a second power supply voltage VL. In addition, a body of the transistor 122 may be connected to the second power supply voltage VL. The transistor 122 may be coupled between the first power supply voltage VH and the second power supply voltage VL, switches the first test signal TS1 to provide the second test signal TS2. A voltage level of the second test signal TS2 may be adjusted by adjusting voltage levels of the first power supply voltage VH and the second power supply voltage VL.

For example, when the first test signal TS1 swings between 0V (first voltage level) and 3V (second voltage level), the second test signal swings between 0V (third voltage level) and 3V (fourth voltage level) by setting the first power supply voltage VH to 3V and the second power supply voltage VL to 0V. That is, each of the switching units 715, 725, 735, and 745 may regenerate the second test signal TS2 having a same voltage level as the first test signal TS1 from the test device 610. As each of the switching units 715, 725, 735, and 745 may be implemented with the transistor of FIG. 2, each of the switching units 715, 725, 735, and 745 may be easily implemented in each of the DUTs 711, 712, 713, and 714 which are memory devices.

The first transmission line 715 of FIG. 9 may be implemented with a strip line as the first transmission line 307 of FIG. 7, and thus line width of branching portion of the strip line may be adjusted for minimizing or reducing reflected waves at nodes N1, N2, and N3 thereby providing impedance matching. Similarly, each of the second transmission line 701, 702, 703, and 704 may be implemented with a strip line, and thus, line width of branching portion of the strip line may be adjusted for minimizing or reducing reflected waves at branching node thereby providing impedance matching as the line width of the portions 60, 70, 80, and 90 of the second transmission line 140 is adjusted in FIG. 4.

As mentioned above, example embodiments are applicable to a test system which tests simultaneously a plurality of memory devices by using a switching unit thereby minimizing or reducing reflected waves and enhancing signal integrity.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A test system comprising:
   a test device configured to generate a first test signal swinging between a first voltage level and a second voltage level, the first voltage level being lower than the second voltage level;
   a switching unit, coupled to the test device, configured to switch the first test signal to provide a second test signal swinging between a third voltage level and a fourth voltage level, the third voltage level being lower than the fourth voltage level; and
   a test board including a plurality of devices under test (DUTs) mounted thereon, each of the plurality of DUTs being connected in parallel with respect to one another to the switching unit through a transmission line,
   wherein the switching unit corresponds to a transistor including a control electrode configured to receive the first test signal, a first terminal coupled to a first power supply voltage and a second terminal coupled to a second power supply voltage, the second test signal being provided at the first terminal.

2. The test system of claim 1, wherein the first and second test signals have substantially the same voltage level.

3. The test system of claim 1, wherein the transmission line corresponds to a micro-strip line.

4. The test system of claim 3, wherein impedance of the test system is matched by adjusting a line width of the micro-strip line.

5. The test system of claim 1, wherein the second test signal is applied simultaneously to the plurality of DUTs through the transmission line.

6. The test system of claim 1, wherein a first equivalent impedance from the test device to the switching unit is substantially the same as a second equivalent impedance from the switching unit to the plurality of DUTs.

7. The test system of claim 1, wherein the switching unit is included in the test device.

8. The test system of claim 1, wherein the switching unit is included in the test board.

9. The test system of claim 1, wherein the switching unit is included in one of the plurality of DUTs.

10. The test system of claim 1, wherein an eye-open window measured in the plurality of DUTs is maximized or increased at an operating frequency of the plurality of DUTs.

11. The test system of claim 1, wherein the plurality of DUTs are memory devices.

12. A test system comprising:
a test device configured to generate a first test signal swinging between a first voltage level and a second voltage level, the first voltage level being lower than the second voltage level;
an interface device coupled to the test device through a driving port, the interface device including a plurality of switching units coupled in parallel with respect to one another to the driving port through a first transmission line, each of the plurality of switching units switching the first test signal to provide a second test signal; and
a test board including a plurality of DUTs mounted thereon, each of the plurality of DUTs being connected in parallel with respect to one another to each of the plurality of switching units through a plurality of second transmission lines,
wherein each of the plurality of switching units corresponds to a transistor including a control electrode configured to receive the first test signal, a first terminal coupled to a first power supply voltage and a second terminal coupled to a second power supply voltage, the second test signal being provided at the first terminal.

13. The test system of claim 12, wherein each of the plurality of second transmission lines corresponds to a micro-strip line.

14. The test system of claim 12, wherein levels of voltage signals measured at the plurality of DUTs are adjusted by adjusting voltage levels of the first and second power supply voltages.

15. The test system of claim 12, wherein each of the plurality of switching units is connected to a same number of the plurality of DUTs.

16. A test system comprising:
a test device configured to generate a first test signal swinging between a first voltage level and a second voltage level, the first voltage level being lower than the second voltage level; and
a test board coupled to the test device and including a plurality of DUTs mounted thereon, the plurality of DUTs being grouped into a plurality of groups, wherein each group includes the same number of the plurality of DUTs coupled in parallel with respect to one another to the test device through a plurality of transmission lines,
wherein one DUT of each group of the plurality of DUTs includes a switching unit, the switching unit switching the first test signal from the test device to provide a second test signal to the other plurality of DUTs in the group, and
wherein the switching unit corresponds to a transistor including a control electrode configured to receive the first test signal, a first terminal coupled to a first power supply voltage and a second terminal coupled to a second power supply voltage, the second test signal being provided at the first terminal.

17. The test system of claim 16, wherein each of the plurality of transmission lines corresponds to a micro-stripe line.

* * * * *